United States Patent [19]

Hermann et al.

[11] Patent Number: 5,164,362

[45] Date of Patent: * Nov. 17, 1992

[54] TL-SR-CA-CU-O SUPERCONDUCTORS

[75] Inventors: Allen M. Hermann; Zhengzhi Sheng, both of Fayetteville, Ark.

[73] Assignee: University of Arkansas, Little Rock, Ark.

[*] Notice: The portion of the term of this patent subsequent to Oct. 9, 2007 has been disclaimed.

[21] Appl. No.: 251,349

[22] Filed: Sep. 29, 1988

[51] Int. Cl.$^5$ .................... C01F 11/02; C01G 3/02; C01G 15/00; H01 39/12

[52] U.S. Cl. ..................... 505/1; 252/518; 423/604; 423/624; 423/635; 505/783

[58] Field of Search ............. 505/1, 783; 252/521, 252/518; 501/123; 423/604, 624, 635

[56] References Cited

U.S. PATENT DOCUMENTS

| | | | |
|---|---|---|---|
| 4,755,493 | 7/1988 | Takeuchi et al. | 501/134 |
| 4,870,052 | 9/1989 | Engler et al. | 501/123 |

FOREIGN PATENT DOCUMENTS

| | | |
|---|---|---|
| 0280812 | 9/1988 | European Pat. Off. . |
| 0284062 | 9/1988 | European Pat. Off. . |

OTHER PUBLICATIONS

Wada, "Annealing Effect of High-$T_c$ Superconducting . . . " Jap. Int. Appl. Phys. vol. 26(9), Sep. 1987, pp. L1475-L14771.

Capone, "Upper critical fields and high superconducting . . . " Appl. Phys. Lett., vol. 50(9), Mar. 2, 1987, pp. 543-544.

Kondoh, "Superconductivity in Tl-Ba-(u-O System" Solid State Comm., vol. 65(11), Mar. 1988, pp. 1329-1331.

Dominguez, "Superconducting phases at ~150°, 200° and 250° K. . . . " Mat. Res. Soc. Symp., vol. 99, Nov.-Dec. 1987, pp. 951-955.

Oota, "Electrical, Magnetic and Superconducting properties of . . . " Jap. Jnl. Appl'd. Phys., vol. 26(8), Aug. 1987, pp. L1356-L1358.

Johnson, "Fabrication of Ceramic Articles from High $T_c$..." Ext. Abst.: High Temp. Super., Apr. 23-24, 1987, pp. 193-195.

Hasegawa, T., et al., High T. Superconductivity of $(La_{1-x}Sr_xCuO_4$-Effect of Substitution . . . Superconductivity, Japan Journal of Applied Physics, vol. 26, No. 4, Apr. 20, 1987, L337-L338.

Kishio, K., et al., Effect of Lanthanide Ion Substitutions for Lanthanum Sites on Superconductivity of $(La_{1-x}Sr_x)_2CuO_4$, Japanese Journal of Applied Physics, vol. 26, No. 4, Apr. 20, 1987, L391-L393.

Ohshima, S., et al., Superconducting and Structural Properties of the New $Ba_{1-x}Ln_xCuO_{3-y}$ Compound System ($Ln$=La, Ce, Pr, Nd, Sm, Eu, . . . and Yb), Japanese Journal of Applied Physics, vol. 26, No. 5, May 1987, L815-L817.

Tsurumi, S., et al., High T. Superconductivities of $A_2Ba_4Cu_6O_{14+y}$, Japanese Journal of Applied Physics, vol. 26, No. 5, May 1987, L856-L857.

Superconductivity News, vol. 1, No. 2, Aug. 1987, pp. 1, 2, and 6-8.

Yang, K. N., et al., High Temperature Superconductivity in Rare-Earth (R)-Barium Copper Oxides $(RBa_2)$-$Cu_3O_{9-\delta}$, Solid State Communications, vol. 63, No. 6, 1987, pp. 515-519.

Tarascon, J. M., et al., Oxygen and Rare-Earth Doping of the 90-K Superconducting Perovskite $YBa_2Cu_3O_{7-x}$, Physical Review B, vol. 36, No. 1, 1987, 226-234.

Hor, P. H., et al., Superconductivity Above 90 K in the Square-Planar Compound System $ABa_2Cu_3O_{6+x}$ with (List continued on next page.)

Primary Examiner—Paul Lieberman
Assistant Examiner—John Boyd
Attorney, Agent, or Firm—Hermann Ivester

[57] ABSTRACT

A high temperature superconductor having the formula Tl-Sr-Ca-Cu-O and a transition temperature about 70 K (with some evidence of a 100 K phase) is provided. Processes for making high temperature superconductors are also provided.

5 Claims, 3 Drawing Sheets

OTHER PUBLICATIONS $A = Y$, La, Nd, Sm, Eu, Gd, Ho, Er, and Lu, Physical Review Letters, vol. 58, No. 18, 1987, 1891-1894.

Khurana, A., *Superconductivity Seen Above the Boiling Point of Nitrogen*, Physics Today, Apr. 1987, 17-23.

Cava, R. J., et al., *Bulk Superconductivity of 91 K in Single-Phase Oxygen-Deficient Perovskite $Ba_2YCu_3O_{9-\delta}$*, Physical Review Letters, vol. 58, No. 16, 1987, 1676-1679.

Nagashima, T., et al., *Superconductivity in $Tl_{1.5}SrCaCu_2O_x$*, Japanese Journal of Applied Physics, vol. 27, No. 6, Jun., 1988, L1077-L1079.

Saito, Y., et al. *High-$T_c$ Superconducting Properties in $(Y_{1-x}Tl_x)Ba_2Cu_3O_{7-y}$, $y(Ba_{1-x}K_x)_2Cu_3O_{7-y}$ and $YBa_2(Cu_{1-x}Mg_x)_3O_{7-y}$*, Physica 148B, 1987, 336-338.

Sera, M. et al., *On the Structure of High-$T_c$ Oxide System Tl-Ba-Cu-O*, Institute for Molecular Science, Myodaiji, Okazaki 444 Japan, 1988.

Ihara, H. et al., *Possibility of Superconductivity at 65° C. in Sr-Ba-Y-Cu-O System*, Japanese Journal of Applied Physics, vol. 26, No. 8, Aug. 1987, L1413-L1415.

Ishida, T., *Compositional Variation of High $T_c$ in $Yb_x$-$Er_{1-x}Ba_2Cu_3O_{6+y}$ System*, Japanese Journal of Applied Physics, vol. 26, No. 8, Aug. 1987, L1294-L1295.

Kijima, T., et al., *Superconductivity in the Bi-Sr-La-Cu-O System*, Japanese Journal of Applied Physics, vol. 27, No. 6, Jun. 1988, L1035-L1037.

Richert, B., et al., *Atomic Substitution in $YBa_2Cu_3O_7$: Modification of the Electronic Structure*, American Institute of Physics Conference Proceedings No. 165 (Thin Film Processing and Characterization of High-Temperature Superconductors), Nov. 6, 1987, 277-283.

Ferreira, J. M., et al., *Long-range Magnetic Ordering the High-$T_c$ Superconducts $RBa_2Cu_3O_{7-\delta}$ (R=Nd, Sm, Gd, Dy and Er)*, Physical Review B, vol. 37, No. 4, Feb. 1, 1988, 2368-2371.

Shih, I., et al., *Multilayer Deposition of Thallium Barium Calcium Copper Oxide Films*, Applied Physics Letter 53(6), 1988, 523-525.

Ginley, D. S., et al., *Sequential Electron Beam Evaporated Films of $Tl_2CaBa_2Cu_2O_y$ with Zero resistance at 97 K*, Applied Physics Letters, 53 (5), Aug. 1, 1988, 406-408.

Qiu, C. X., et al., *Formation of Tl-Ca-Ba-Cu-O Films by Diffusion of Tl into rf-sputtered Ca-Ba-Cu-O*, Applied Physics Letters, 53 (12), Sep. 19, 1988, 1122-1124.

Gopalakrishnan, I. K., et al., *Synthesis and Properties of a 125 K Superconductor in the Tl-Ca-Ba-Cu-O System*, Applied Physics Letters, 53 (5), Aug. 1, 1988, 414-416.

Parkin, S. S. P., et al., *Bulk Superconductivity at 125 K in $Tl_2Ca_2Ba_2Cu_3O_x$*, Physical Review, 1988, 2539-2542.

Sheng, Z. Z., et al., *Superconductivity in the Rare-Earth-Free Tl-Ba-Cu-O System Above Liquid-Nitrogen Temperature*, Nature, vol. 332, Mar. 3, 1988, 55-58.

Sheng, Z. Z., et al., *Superconductivity at 90 K in the Tl-Ba-Cu-O System.*, Physical Review Letters, vol. 60, No. 10, Mar. 7, 1988, 937-940.

Sheng, Z. Z., et al., *Bulk Superconductivity at 120 K in the Tl-Ca/Ba-Cu-O System*, Nature, vol. 332, Mar. 10, 1988, 138-139.

Ihara, H., et al., *A New High-$T_c$ $TlBa_2Ca_3Cu_4O_{11}$ Superconductor with $T_c > 120 K$*, Nature, vol. 334 (Aug. 11, 1988, 510-511.

Hazen, R. M., et al., *100-K Superconducting Phases in the Tl-Ca-Ba-Cu-O System*, Physical Review Letters, vol. 60, No. 16, Apr. 18, 1988, 1657-1660.

Sheng, Z. Z., et al., *New 120 K Tl-Ca-Ba-Cu-O Superconductor*, Appl. Phys. Lett., vol. 52, No. 20, May 16, 1988, 1738-1740.

Hatta, S., et al., *Pt-coated Substrate Effect on Oxide Superconductive Films in Low-Temperature Processing*, Appl. Phys. Lett. 53 (2), Jul. 11, 1988, 148-150.

Lee, W. Y., et al., *Superconducting Tl-Ca-Ba-Cu-O Thin Films With Zero Resistance at Temperatures of up to 120 K.*, Appl. Phys. Lett. 53 (4), Jul. 25, 1988, 329-331.

Iwazumi, T., et al., *Identification of a Structure with Two Superconducting Phases in L-Ba-Cu-O System (L=La or Y)*, Japanese Journal of Applied Physics, vol. 26, No. 5, May, 1987, L621-L623.

Garwin, L., *Superconducting Conference Yields New Temperature Record*, Nature vol. 332, Mar. 10, 1988.

Suzuki, A., et al., *Rare- Earth(RE)-Barium Solubility Behavior in $Y(Ba_{2-x}RE_x)Cu_3O_{7+\delta}$ and $Sm(Ba_{2-x}RE_x)Cu_3O_{7+\delta}$*, Japanese Journal of Applied Physics, vol. 27, No. 5, May, 1988, L792-L794.

Peters, P. N., et al., *Observation of Enhanced Properties in Samples of Silver Oxide Doped $YBa_2Cu_3O_x$*, Appl. Phys. Lett. 52 (24), Jun. 13, 1988, 2066-2067.

S. Natarajan et al., *Superconductivity Studies on $(Y_{1-x}Ln_x)Ba_2Cu_3O_7$, Ln=La, Pr, Tb*, Physica C, vol. 153-155, Feb. 1988, 926-927.

D. D. Sarma, et al., *Electronic Structure of High-$T_c$ Superconductors from Soft-x-ray Absorption*, Physical Review B, vol. 37, No. 16, Jun. 1988, 9784-9787.

K. Kishio, et al., *Superconductivity Achieved at Over Liquid Nitrogen Temperature by (Mixed Rare Earths)-Ba-Cu Oxides*, Japanese Journal of Applied Physics, vol. 26, No. 5, May 1987, L694-L696.

Waldrop, M. Mitchell, *Thallium Superconductor Reaches 125K*, Research News, Mar. 1988, 1243.

Qadri, S. B., et al., *X-ray Identification of the Superconducting High-$T_c$ Phase in the Y-Ba-Cu-O System*, Physical Review B, vol. 35, No. 13, 1987.

Murphy, D. W., et al., *New Superconducting Cuprate Perovskites*, Physical Review Letters, vol. 58, May 1987, 1888-1890.

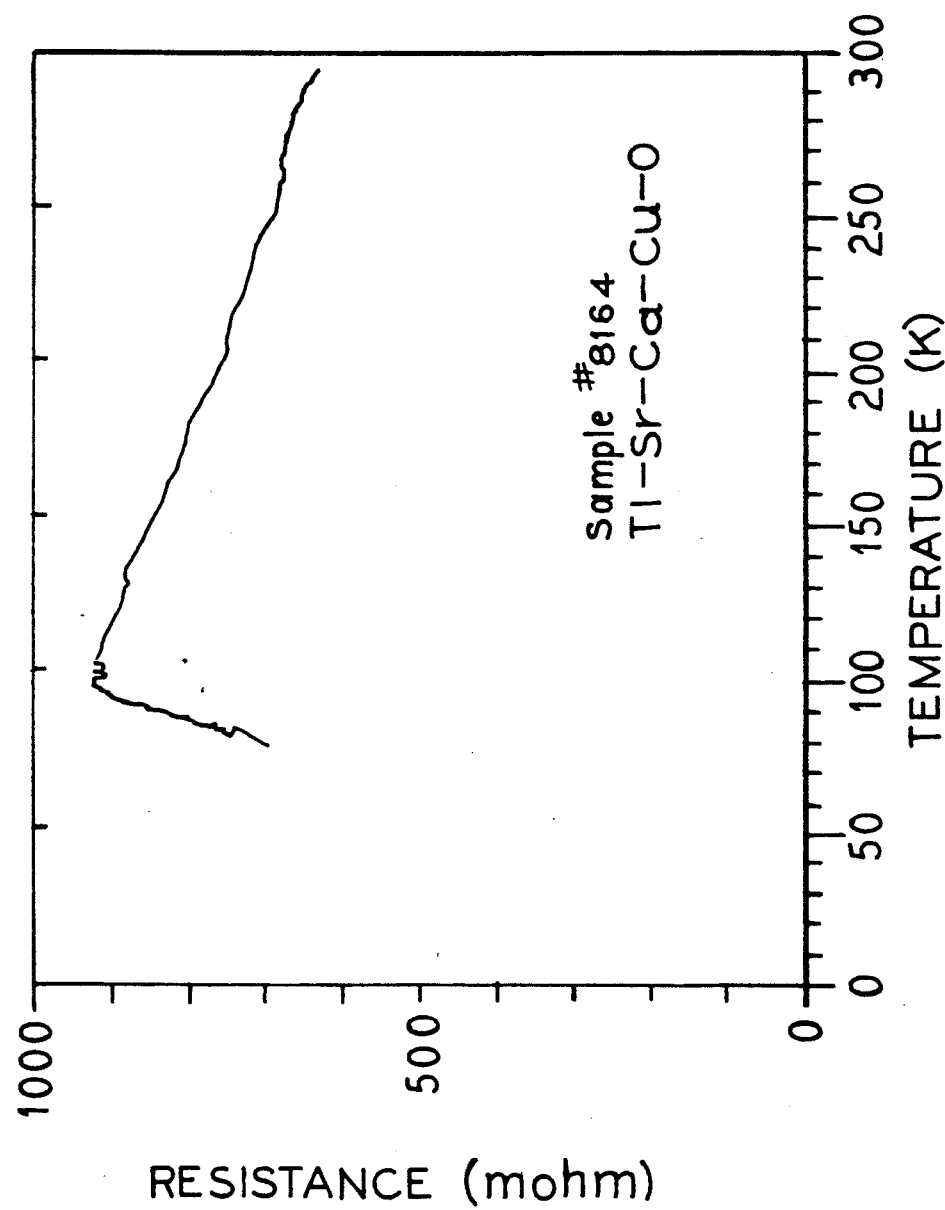

TL-SR-CA-CU-O SUPERCONDUCTORS

BACKGROUND OF THE INVENTION

The present invention relates generally to high temperature superconductors. More specifically, the present invention relates to a new high temperature superconductor system and processes for making same.

A variety of superconducting systems are known. The inventors of the present patent application have filed the following patent applications that disclose superconductors and/or methods of making same.

U.S. patent application Ser. No. 144,114 discloses a high temperature superconductor having the composition Tl-R-X-Y wherein: R is an element chosen from Group 2A; X is an element chosen from Group 1B; and Y is an element chosen from Group 6A.

U.S. patent application Ser. No. 155,247 discloses a high temperature superconductor having the composition: Tl-R-Ba-Cu-O wherein R is a Group 2A element excluding barium; or Tl-Sr-Cu-O. In an embodiment, R is either strontium or calcium.

U.S. patent application Ser. No. 082,222 discloses a high temperature superconductor having the composition: Tb-R-Ba-Cu-O wherein R is chosen from the group of rare earth metals excluding: praseodymium; cerium; and terbium.

U.S. patent application Ser. No. 089,067 discloses a high temperature superconductor having the composition: R-Ba-Cu-O wherein R is chosen from the group of rare earth metals excluding: praseodymium; terbium; and cerium.

U.S. patent application Ser. No. 236,502 discloses processes for making Tl-Ba-Ca-Cu-O superconductors.

Applicants have also filed, on the same day as the instant patent application, a patent application entitled: "R-Tl-Sr-Ca-Cu-O SUPERCONDUCTORS AND PROCESSES FOR MAKING SAME". The patent application discloses a six element system wherein five of the elements are metallic and the sixth element is nonmetallic. In a preferred embodiment, the superconductor has the structure R-Tl-Sr-Ca-Cu-O wherein R is a rare earth metal. Processes for making superconductors are also disclosed.

Although the above-identified patent applications provided superconductors and methods of making same, a new superconductor would be desirable for many reasons. Such a superconductor would: (1) facilitate the discovery of the correct theory on oxide superconductivity; (2) provide a framework for the search of higher temperature, even room temperature superconductors; (3) allow superconducting components to operate with lower cost; and (4) provide low cost processing and manufacturability.

SUMMARY OF THE INVENTION

The present invention provides a new multiphase superconductor with transition temperatures of 70 K. and 20 K. (with some evidence of a 100 K. phase) that is unique to date among all high temperature superconductors.

The present invention comprises a system containing five elements:

A-B-C-D-E wherein:

A, B, C and D are metallic elements, and E is a non-metallic element.

A is an element in Group 3A, B and C are elements in Group 2A, D is an element in Group 1B, and E is an element in Group 6A.

Preferably, the high temperature superconductor has the composition:

R-Sr-Ca-Cu-O wherein: R is a Group 3A element.

In a preferred embodiment, the high temperature superconductor has the following composition:

Tl-Sr-Ca-Cu-O.

In a preferred embodiment, the superconductor in the superconductive system of the present invention has the following approximate stoichiometry:

$TlSr_yCa_zCu_uO_v$ wherein:

y is greater than or equal to 0 and less than or equal to 5;

z is greater than or equal to 0 and less than or equal to 5 y+z is greater than 0.2 and less than or equal to 5;

u is greater than 0.5 and less than 15; and v is greater than y+z+u and less than 2+y+z+u.

A method of producing high temperature Tl-Sr-Ca-Cu-O superconductors is also provided. The method allows the superconductors to be prepared at temperatures of approximately 850° to about 1000° C. in flowing oxygen.

Accordingly, an advantage of the present invention is that it provides a new superconductor system with a high transition temperature.

A further advantage of the present invention is to provide a material system that may produce higher temperature, even room temperature, superconductors.

A still further advantage of the present invention is that it provides a new high temperature superconductor that is formed at a relatively low temperature, and allows for rapid fabrication.

Furthermore, an advantage of the present invention is that it provides a method for making new high temperature superconductors.

Still another advantage of the present invention is that it provides a method for rapidly making these new high temperature superconductors.

Yet another advantage of the present invention is that it provides a method of making superconductors having transition temperatures above 70 K. without the use of rare earths which may be expensive and/or in short supply.

Additional advantages and features of the present invention are described in, and will be apparent from, the detailed description of the presently preferred embodiments and the drawings.

BRIEF DESCRIPTION OF THE DRAWINGS

FIG. 3 illustrates graphically resistance versus temperature, down to 77 K., for a Tl-Sr-Ca-Cu-O sample.

DETAILED DESCRIPTION OF THE PRESENTLY PREFERRED EMBODIMENTS

The present invention provides a new high temperature superconductor with phases whose transition temperatures are above 70 K. (with some evidence for 100 K.). The present invention also provides a new material system that may produce higher temperature, even room temperature superconductors by further elemental substitution and variation of preparation procedures. In addition, the present invention provides a method for making high temperature superconductors.

The inventors of the present invention have discovered a Tl-Sr-Ca-Cu-O system that is superconducting above 70 K. To date, the following are known high temperature superconductor systems: La-Ba-Cu-O; La-Sr-Cu-O; rare earth-Ba-Cu-O; Tl-Ba-Cu-O; Bi-Sr-Ca-Cu-O; and Tl-Ba-Ca-Cu-O, these systems are superconducting at the following temperatures: 30 K. La-Ba-Cu-O; 40 K. La-Sr-Cu-O; 90 K. rare earth-Ba-Cu-O; 90 K. Tl-Ba-Cu-O; 110 K. Bi-Sr-Ca-Cu-O; and 120 K. Tl-Ba-Ca-Cu-O. The Tl-Sr-Ca-Cu-O system of the present invention is the fifth (and possibly even the third) highest temperature superconducting system.

Moreover, the present invention provides a superconductor that can be operated at higher temperatures with lower costs. Furthermore, the applicants of the present invention have found that the new high temperature superconductor can be rapidly produced at relatively low temperatures.

The present invention preferably comprises a system containing five elements:

A-B-C-D-E wherein:

A, B, C and D are metallic elements, and E is a nonmetallic element.

Preferably, A is an element in Group 3A, B and C are elements in Group 2A, D is an element in Group 1B, and E is an element in Group 6A.

Most preferably, A is thallium (Tl), B is strontium (Sr), C is calcium (Ca), D is copper (Cu), and E is oxygen (O).

In a preferred embodiment, the superconductor, of the superconductive system of the present invention, has the following approximate stoichiometry:

$TlSr_y Ca_2 Cu_u O_v$ wherein:

z is greater than or equal to 0 and less than or equal to 5;

y is greater than or equal to 0 and less than or equal to 5;

y+z is greater than 0.2 and less than or equal to 5;

u is greater than 0.5 and less than 15; and v is greater than y+z+u and less than 2+y+z+u.

By way of example, and not limitation, examples of the new high temperature Tl-Sr-Ca-Cu-O superconductor will now be given.

EXAMPLE 1

A. The following reagents were utilized:
1. $Tl_2O_3$,
2. SrO,
3. CaO,
4. CuO.

B. The following procedure was followed:
1. A mixture of $Tl_2O_3$, SrO, CaO, and CuO with a molar ratio of 2:2:2:3 was completely ground, and was pressed into a pellet.
2. A tube furnace was heated to a temperature of approximately 850° to about 950° C. in flowing oxygen.
3. The pellet was placed in the tube furnace, while the temperature and oxygen flow was maintained, for approximately 2 to about 5 minutes.
4. The pellet was then furnace-cooled to room temperature.

Figure 1A:
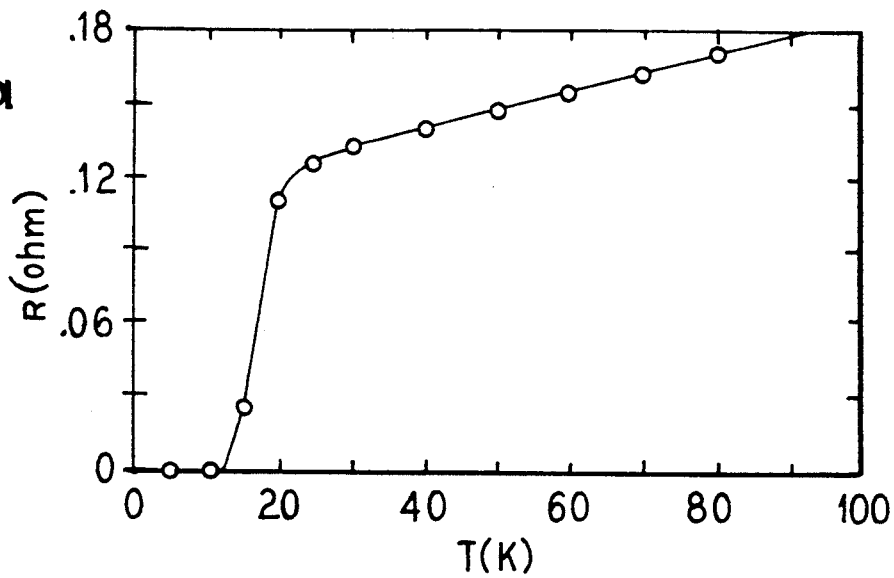
FIG. 1 illustrates graphically in 1a resistance, in 1b magnetization, and in 1c microwave absorption, for a nominal $Tl_2Sr_2Ca_2Cu_3O_{10+x}$ sample.
Figure 1B:
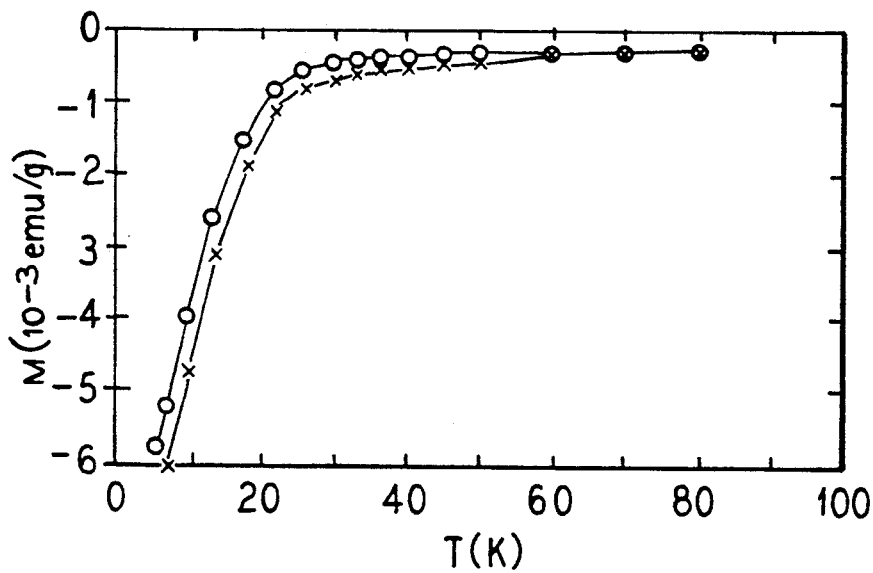
Figure 1C:
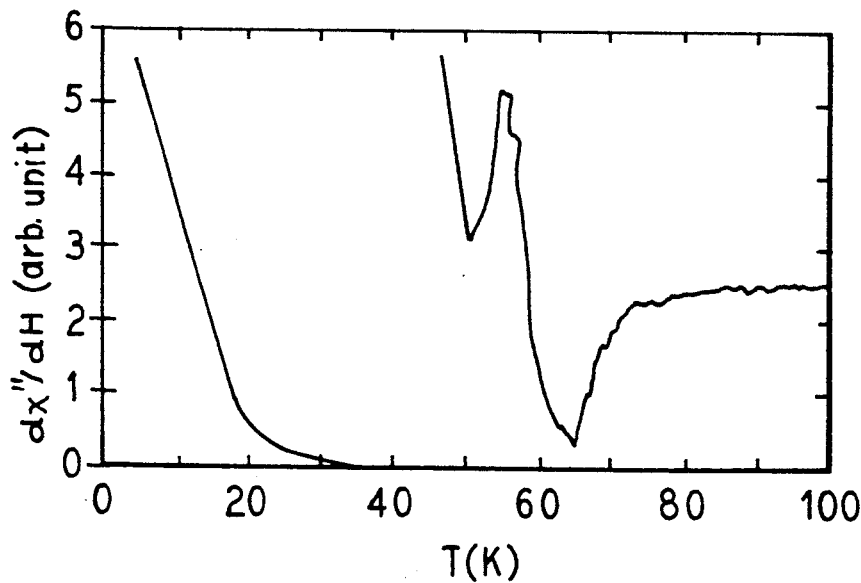

The samples prepared by this procedure were found to be superconducting. The experimental data for a sample prepared pursuant to this example is graphically illustrated in FIG. 1. Resistance measurements (graphically illustrated as 1a) show that the sample had an onset temperature of about 25 K. and reached zero resistance at 10 K. Magnetization measurements (graphically illustrated as 1b) indicate the sample had an onset temperature of about 60 K. Microwave absorption measurements (graphically illustrated as 1c) show that the sample had an onset temperature of about 70 K.

EXAMPLE 2

A. The following reagents were utilized:
1. $Tl_2O_3$,
2. SrO,
3. CaO,
4. CuO.

B. The following procedure was followed:
1. A mixture of $Tl_2O_3$, SrO, CaO, and CuO with a molar ratio of 2:1:2:3 was completely ground, and was then pressed into a pellet.
2. A tube furnace was heated to 900° C. in flowing oxygen.
3. The pellet was placed in the tube furnace maintaining the temperature and oxygen flow for 3 minutes.
4. The pellet was taken out of the furnace, and quenched in air to room temperature.
5. The pellet was then annealed at 720° C. in flowing oxygen for 8 hours.
6. The pellet was furnace-cooled to room temperature.

Figure 2A:
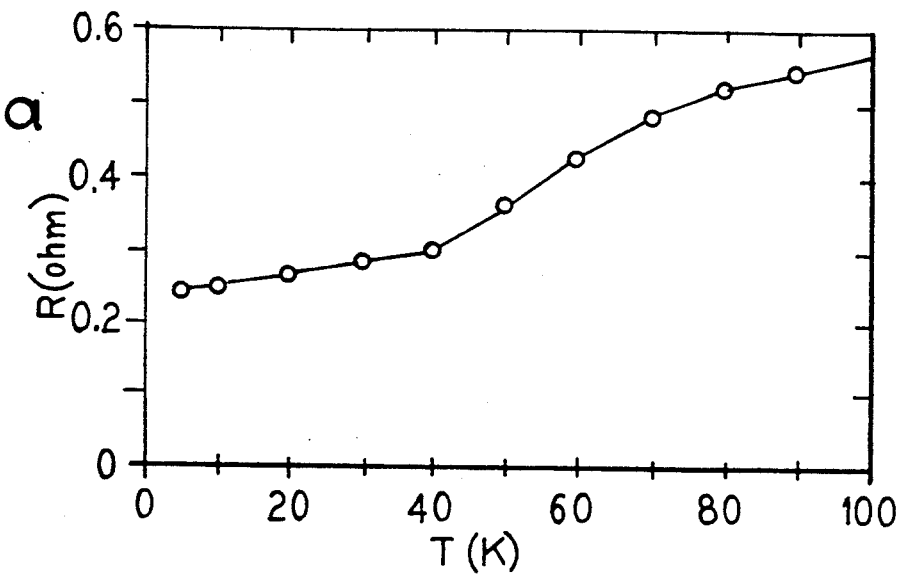
FIG. 2 illustrates graphically in 2a resistance, in 2b magnetization, and in 2c microwave absorption for a nominal ($Tl_2SrCa_2Cu_3O_{9+x}$) sample.
Figure 2B:
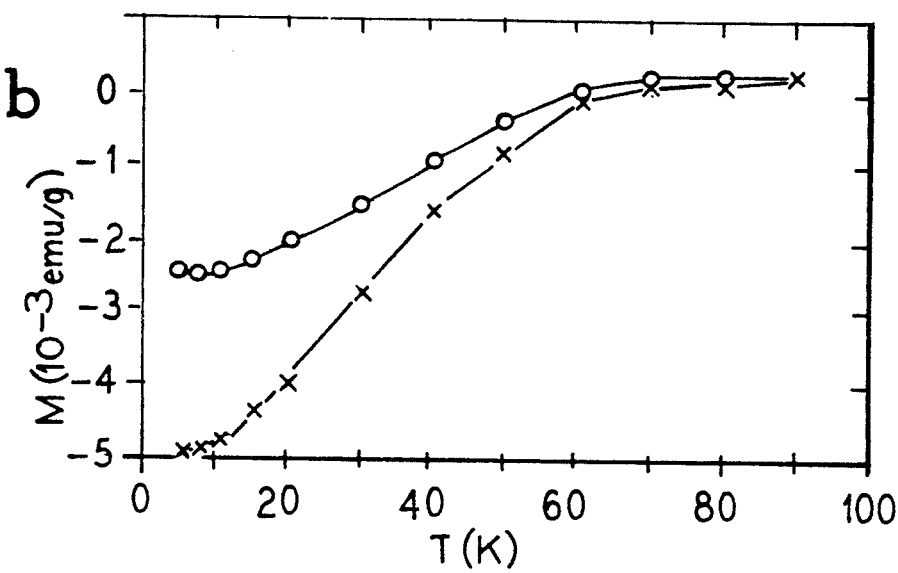
Figure 2C:
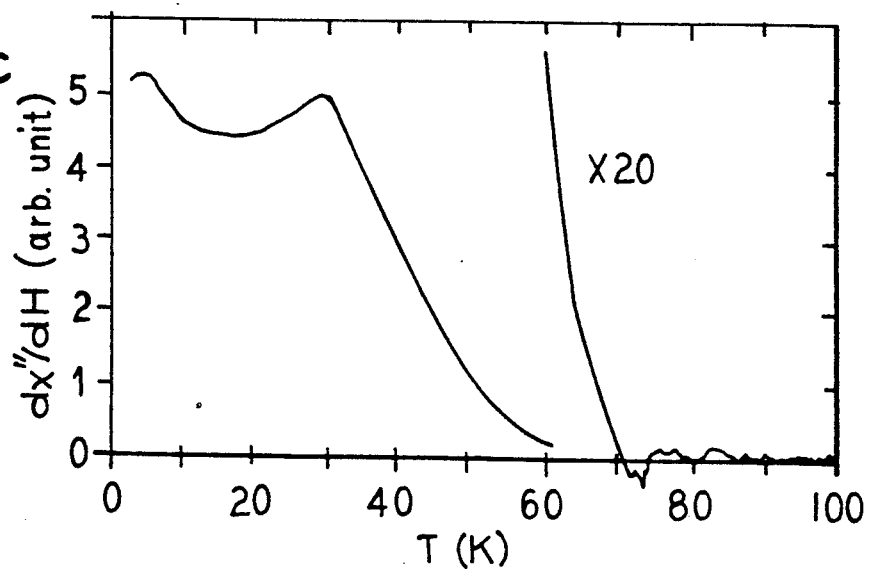

The sample prepared by this procedure was found to be superconducting. FIG. 2 illustrates, graphically, experimental data for a superconductor sample prepared pursuant to this example. Resistance measurements (graphically illustrated as 2a) show a sharp drop at 75 K. for the sample. Magnetization measurements (graphically illustrated as 2b) indicate an onset temperature of about 70 K. for the sample. And microwave absorption measurements (graphically illustrated as 2c) show an onset temperature of about 70 K. for the sample.

EXAMPLE 3

A. The following reagents were utilized:
1. $Tl_2O_3$,
2. $SrCO_3$,
3. $CaCO_3$,
4. CuO.

B. The following procedure was followed:
1. A mixture of $SrCO_3$, $CaCO_3$, and CuO with a molar ratio of 1:2:3 was ground into a powder.
2. The powder was heated to 1100° C. in air for 30 minutes.

3. The heated powder was cooled, reground, and reheated to 1100° C. in air for 30 minutes.

4. The reheated powder was mixed with $Tl_2O_3$, in a weight ratio of 1:1, ground, and pressed into a pellet.

5. The pellet was heated at 910° C. in flowing oxygen for 3 minutes.

6. The heated pellet was ground, and mixed with $Tl_2O_3$ (in a weight ratio of about 2:1).

7. The powder was pressed into a pellet, and heated at 1100° C. in flowing oxygen for approximately 1 to about 2 minutes.

8. The heated pellet was taken out of the furnace and air-cooled to room temperature.

Although this sample did not reach zero resistance at liquid nitrogen temperature, a sharp drop in resistance was seen at about 100 K. FIG. 3 illustrates resistance versus temperature down to 77 K. for a sample prepared pursuant to this method.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

We claim:

1. A superconductor having the following formula:

Tl-Sr-Ca-Cu-O.

2. A superconductor having the following approximate nominal stoichiometry:

$TlSr_yCa_zCu_uO_v$ wherein:
  y is greater than or equal to 0 and less than or equal to 5;
  z is greater than or equal to 0 and less than or equal to 5;
  y+z is greater than 0.2 and less than 5;
  u is greater than 0.5 and less than 15; and
  v is greater than y+z+u and less than 2+y+z+u.

3. A superconductor having the following approximate nominal stoichiometry:

$Tl_2SrCa_2Cu_3O_9$.

4. A superconductor having the following approximate nominal stoichiometry:

$Tl_2Sr_2Ca_2Cu_3O_{10}$.

5. A superconductor having the following approximate nominal stoichiometry:

$Tl_2Sr_aCa_2Cu_3O_x$ wherein:
  $1 \leq a \leq 2$; and
  $9 \leq x \leq 10$.

* * * * *